(12) United States Patent
Wan et al.

(10) Patent No.: US 8,394,280 B1
(45) Date of Patent: Mar. 12, 2013

(54) RESIST PATTERN PROTECTION TECHNIQUE FOR DOUBLE PATTERNING APPLICATION

(75) Inventors: Dujiang Wan, Fremont, CA (US); Hai Sun, Milpitas, CA (US); Hongping Yuan, Fremont, CA (US); Ling Wang, Hercules, CA (US); Xianzhong Zeng, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 561 days.

(21) Appl. No.: 12/614,210

(22) Filed: Nov. 6, 2009

(51) Int. Cl.
*B44C 1/22* (2006.01)

(52) U.S. Cl. ............ 216/22; 216/41; 216/47; 216/57; 216/67; 216/72; 216/83; 216/95; 438/694; 438/703; 438/736; 438/737; 438/738

(58) Field of Classification Search .................. None
See application file for complete search history.

(56) References Cited

U.S. PATENT DOCUMENTS

| | | | |
|---|---|---|---|
| 5,882,996 A | 3/1999 | Dai | |
| 7,133,253 B1 | 11/2006 | Seagle et al. | |
| 7,531,456 B2 | 5/2009 | Kwon et al. | |
| 2002/0175142 A1* | 11/2002 | Maejima | 216/6 |
| 2006/0273456 A1* | 12/2006 | Sant et al. | 257/734 |
| 2007/0279802 A1 | 12/2007 | Sasaki et al. | |
| 2007/0287299 A1* | 12/2007 | Lee et al. | 438/761 |
| 2008/0081461 A1 | 4/2008 | Lee et al. | |
| 2008/0090418 A1 | 4/2008 | Jeon et al. | |
| 2008/0296737 A1* | 12/2008 | Weis et al. | 257/623 |
| 2008/0316644 A1 | 12/2008 | Lee et al. | |
| 2009/0053651 A1 | 2/2009 | Hatakeyama et al. | |

OTHER PUBLICATIONS

H. Xiao, Introduction to Semiconductor Manufacturing Technology, published by Prentice Hall, 2001, ISBN 0-13-022404-9, pp. 328-332.*
Dictionary definetion of "resist" by Merriam-Webster, http://www.merriam-webster.com/dictionary/resist?show=1&t=1343408787.*
E.C. Snow, et al., Proceedings of the IEEE, vol. 85, No. 4, Apr. 1997, pp. 601-611.*

* cited by examiner

*Primary Examiner* — Lan Vinh
*Assistant Examiner* — Jiong-Ping Lu

(57) ABSTRACT

Methods of patterning a material are disclosed. A first resist pattern is formed on a field. A protective layer is formed over the first resist pattern and at least a portion of the field. A second resist pattern is formed over a portion of the protective layer. A portion of a material to be patterned deposited adjacent to the first and second resist patterns is removed.

9 Claims, 6 Drawing Sheets

US 8,394,280 B1

RESIST PATTERN PROTECTION TECHNIQUE FOR DOUBLE PATTERNING APPLICATION

FIELD OF THE INVENTION

The present invention generally relates to double patterning processes for producing patterned thin-film structures and, in particular, relates to resist pattern protection techniques for double patterning applications.

BACKGROUND OF THE INVENTION

Double patterning processes are used in the semiconductor industry to practically double the photolithographic resolution for a dense line/spacing patterning. FIG. 1 illustrates an example of such a prior art double patterning process used in the semiconductor industry to produce a densely patterned structure. The prior art process involves: 1) providing a structure 101 having a substrate 110, a silicon (Si) layer 120, and a hard mask (HM) layer 130; 2) performing a first lithography operation to form a first resist pattern 140 on the HM layer 130; 3) performing a first pattern transfer operation (e.g., a reactive ion etching (RIE)) to form a HM 132 by removing a portion of the HM material not covered by the first resist pattern 140; 4) performing a second lithography operation to form a second resist pattern 150 on the Si layer 120; and 5) performing a second pattern transfer operation (e.g., RIE) to form a patterned silicon 109.

In the hard drive or, more particularly, thin film read-write heads (TFH) industry, such a double patterning process can be used to form a perpendicular magnetic recording (PMR) write head having a zero chisel angle nose shape with no nose corner rounding. FIG. 2 illustrates a prior art double patterning process used in the TFH industry to provide a patterned Ru hard mask 232 before performing an ion etching operation (e.g., RIE) to form a pole trench in an alumina layer 220. Sub-FIGS. 1a, 2a, 3a, 4a, 5a, and 6a on the bottom row provide side views of various intermediate and final structures at different points of the prior art double patterning process, while sub-FIGS. 1b, 2b, 3b, 4b, 5b, and 6b on the top row provide top views of the various intermediate and final structures. The process involves: 1) performing a first lithography to form a first resist pattern 240 on a structure having a substrate 210, an alumina (Al$_2$O$_3$) layer 220, and a first HM layer 230 containing Ru; 2) depositing a second HM layer 250 containing tantalum (Ta) over the first HM layer 230 and the first resist pattern 240 and performing a side-mill operation (indicated by arrows 205) on a side of the HM layer 250 to expose a potion of the first resist pattern 240; 3) performing a lift-off operation to form an intermediate Ta HM 252; 4) performing a second lithography to form a second resist pattern 260; 5) performing an ion etching (IE) operation to form a final Ta HM pattern 254; and 6) performing an etching operation (RIE) via the final Ta HM pattern 254 to form the Ru HM 232.

These prior art double patterning processes are complex, involving two or more pattern transfer operations involving RIE or mill/lift-off steps. The complexity inherent in the prior art double patterning processes makes these approaches expensive in manufacturing, and process variations can be large from the double lithography and double pattern transfer operations.

SUMMARY OF THE INVENTION

Various embodiments of the present invention solve the foregoing problems by providing photolithography double patterning processes with a single pattern transfer operation involving RIE, milling or lift-off operations.

According to one aspect of the subject disclosure, a method of patterning a material is disclosed. The method can comprise forming a first resist pattern on a field. The method can further comprises depositing a protective layer over the first resist pattern and at least a portion of the field. The method can further comprise forming a second resist pattern over a portion of the protective layer. The method can further comprise removing a portion of a material to be patterned deposited adjacent to the first and second resist patterns.

According to one aspect of the subject disclosure, a method of patterning a hard mask is disclosed. The method can comprise forming a first resist pattern over a field. The method can further comprise depositing a protective layer over the first resist pattern and at least a first portion of the field. The method can further comprise forming a second resist pattern over at least a portion of the protective layer. The method can further comprise depositing a hard mask material over the first and second resist patterns and at least a second portion of the field not covered by the first and second resist patterns. The method can further comprise forming a patterned hard mask by removing a portion of the hard mask material deposited over the first and second resist patterns.

It is to be understood that both the foregoing summary of the invention and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention.

DETAILED DESCRIPTION OF THE INVENTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Figure 1:
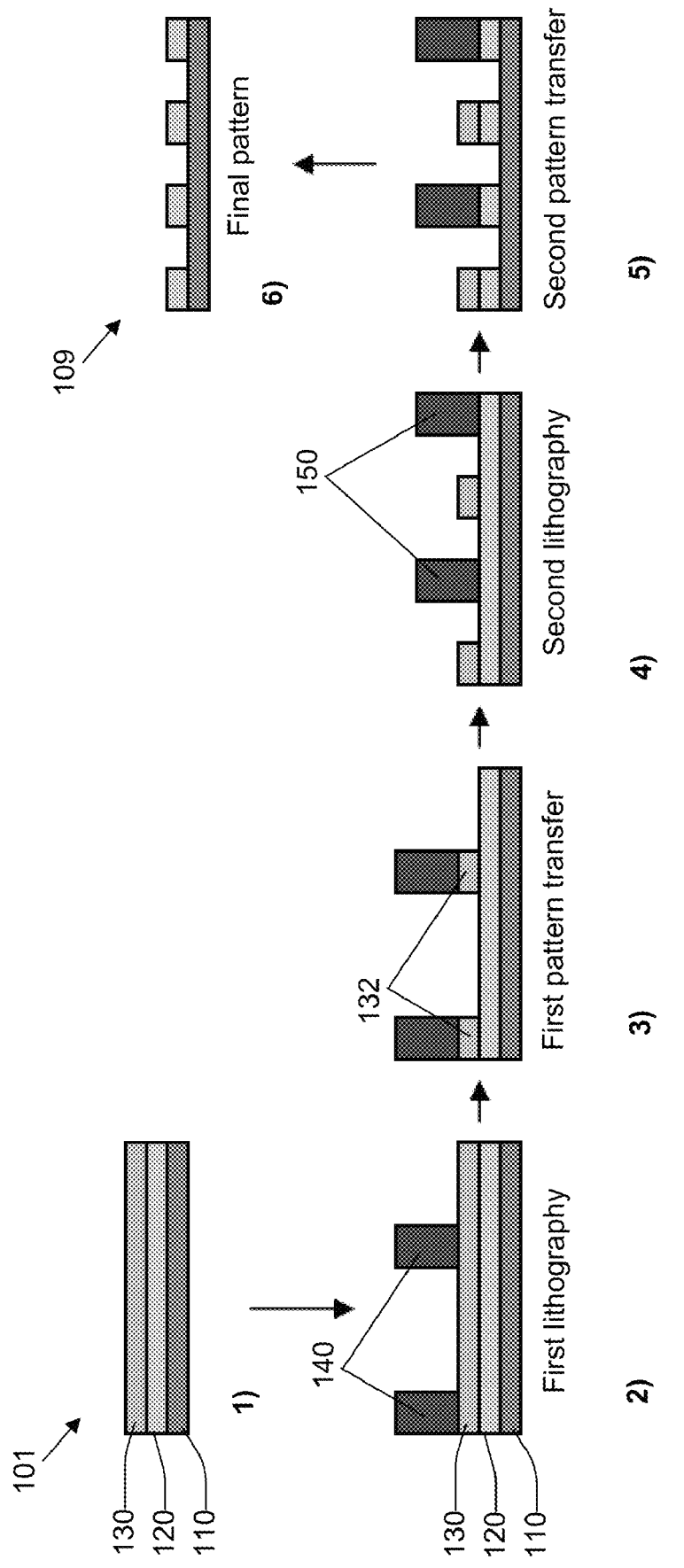
FIG. 1 illustrates an example of a prior art double patterning process used in the semiconductor industry to produce a densely patterned structure.
Figure 2:
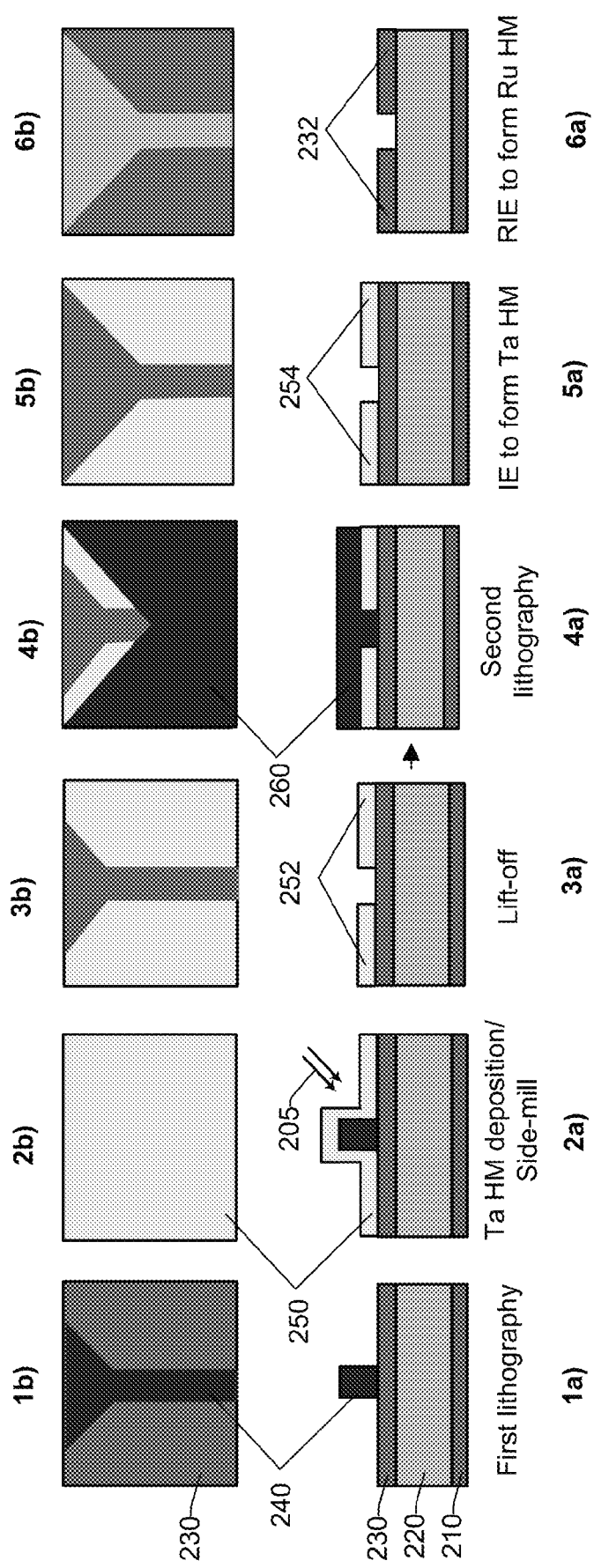
FIG. 2 illustrates an example of a prior art double patterning process used in the TFH industry to provide a patterned metal hard mask.
Figure 3:
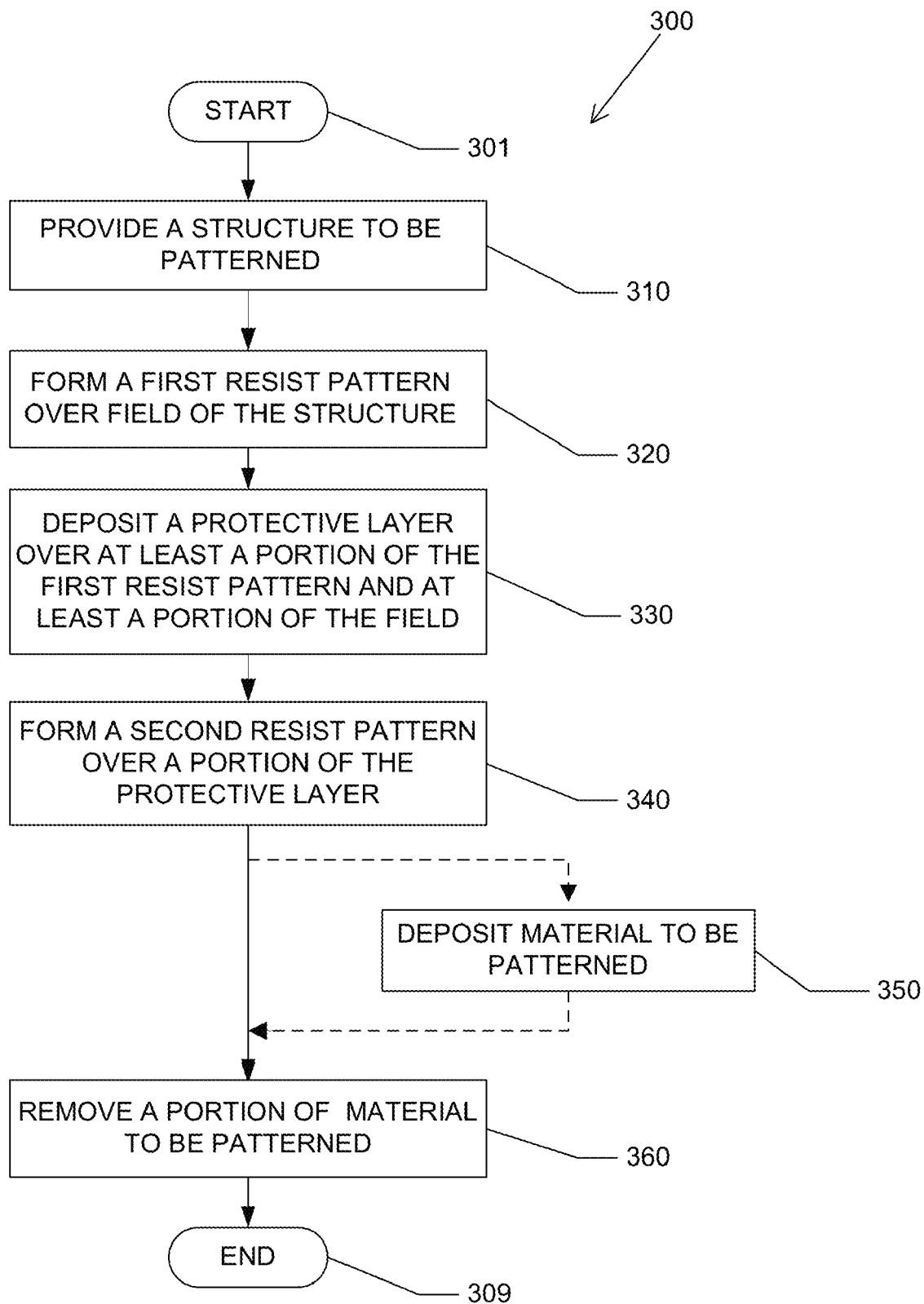
FIG. 3 is a flowchart illustrating an exemplary double patterning process that can be used in the semiconductor industry to produce a densely patterned structure according to one aspect of the subject disclosure.
Figure 4:
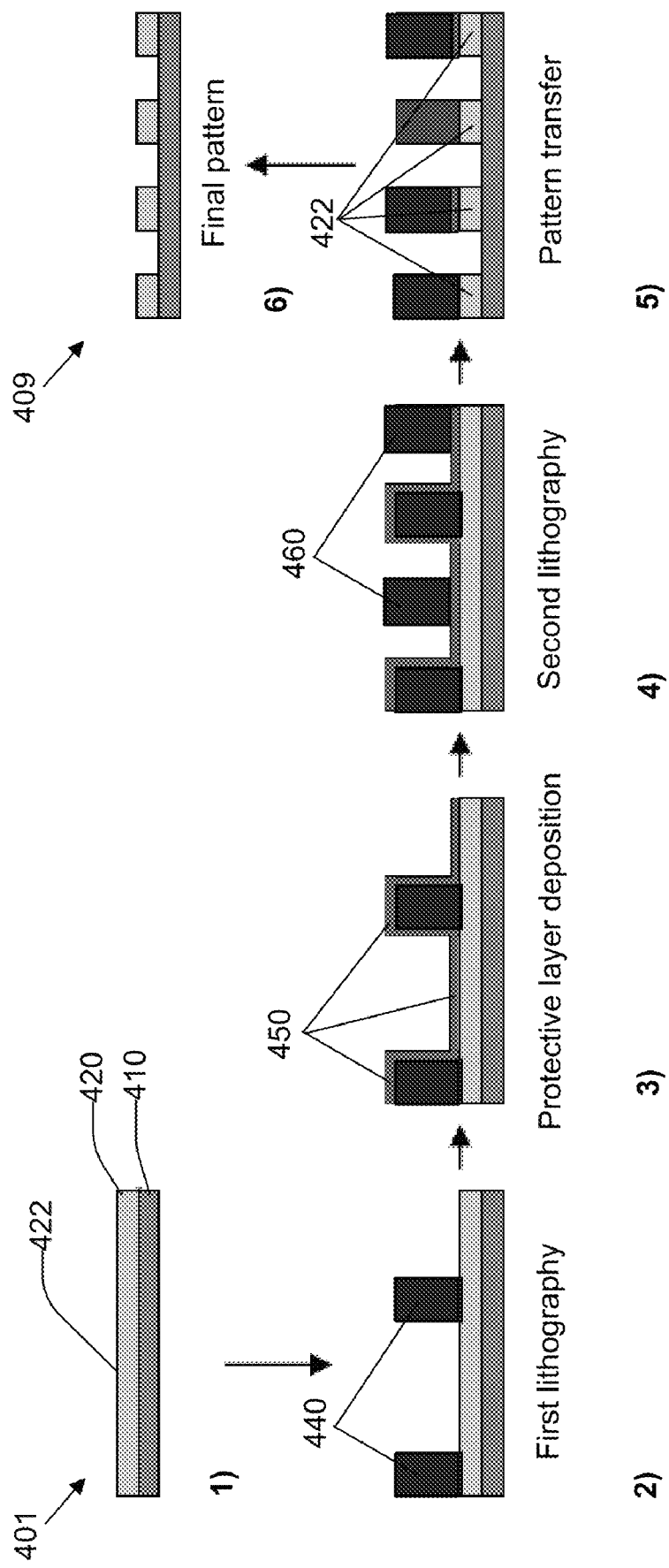
FIG. 4 provide side views of various intermediate and final structures associated with the exemplary double patterning process illustrated by FIG. 3 according to one aspect of the subject disclosure.
Figure 6:
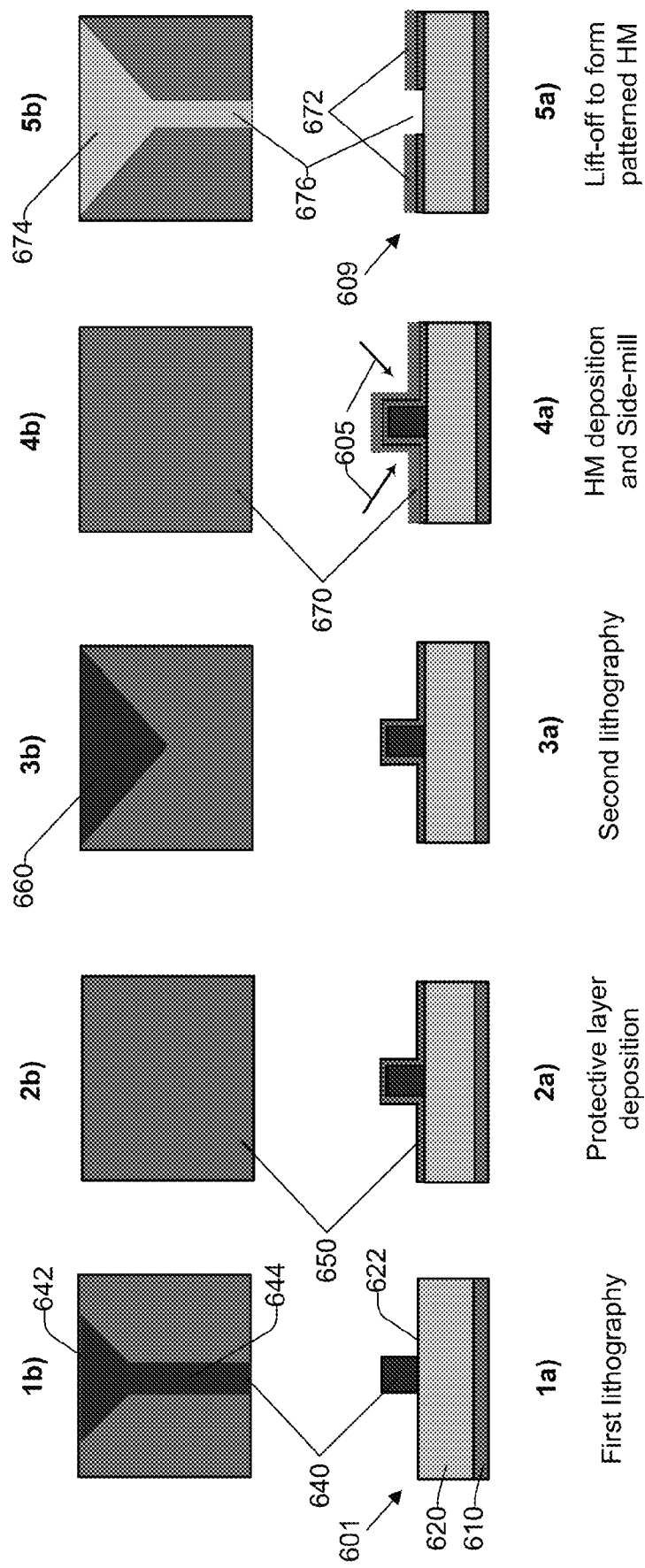
FIG. 6 provide side and top views of various intermediate and final structures associated with the exemplary double patterning process illustrated by FIG. 5 according to one aspect of the subject disclosure.

FIG. 3 is a flowchart illustrating an exemplary double patterning process 300 that can be used in the semiconductor industry to produce a patterned structure such as structure 409 of FIG. 4 or structure 609 of FIG. 6 according to one aspect of the subject disclosure. For the sake of clarity only with no intention of limiting the subject disclosure in any way, the process 300 will be described below with frequent references to various intermediate and final structures shown in FIG. 4 and some references to intermediate and final structures shown in FIG. 6. It shall be appreciated by those skilled in the art in view of the present disclosure that the process 300 may be applied to produce other structures in a multitude of applications.

The process 300 begins start state 301 and proceeds to operation 310 in which a base structure is provided. In the illustrated example of FIG. 4, the base structure 401 includes a substrate 410 and a layer 420, and the layer 420 comprises a material to be patterned by a double patterning process of the subject disclosure. Non-limiting examples of the material to be patterned include insulators or semiconductors such as silicon, silicon nitride, alumina, gallium arsenide and a conductor such as aluminum. On the other hand, in the illustrated example of FIG. 6, the base structure 601 provides a substrate or base over which to deposit a material to be patterned (e.g., Ta 670) by a double patterning process of the subject disclosure based on a lift-off operation. This alternative lift-off embodiment will be described further below with respect to alternative operation 350 of FIG. 3 and in a much greater detail with respect to FIGS. 5 and 6. Returning to the illustrated example of FIG. 4, the layer 420 has a field 422 over which a first lithography to be described below is performed. The field 422 can be flat as shown in the illustrated example of FIGS. 4 and 6 or can have pre-patterned surfaces such as those belonging to trenches and mesas.

The process 300 proceeds to operation 320 in which a first resist pattern 440 is formed over the field 422 by a first lithography. The first lithography can include photolithography in which a photoresist is applied on a wafer, the applied resist (either positive or negative) is exposed to a UV light through a patterned mask, and a portion of the resist (either exposed or unexposed) is dissolved by a solution called "developer." Such a lithographic technique is well-known in the art and is not separately described herein for the sake of brevity.

The process 300 proceeds to operation 330 in which a protective layer 450 is deposited over the first resist pattern 440 and a portion of the field 422 not covered by the first resist pattern 440. While the protective layer 450 is shown to be deposited on all of the first resist pattern 440 and all of the portion of the field 422 not covered by the first resist pattern 440 in the illustrated embodiment of FIG. 4, in an alternative embodiment, only part of the first resist pattern 440 and/or only part of the uncovered portion of the field 422 may be deposited with the protective layer 450. The protective layer 450 can comprise silicon nitride, tantalum, aluminum oxide, or any other material or a combination of materials that can protect the first patterned resist from a process (e.g., photoresist application, exposure, and development) that is used to form a subsequent resist pattern to be described below with respect to operation 340. In certain embodiments, the protective layer 450 typically has a thickness in a range of between about 10 and 100 angstroms and substantially covers all sides of the first resist pattern 440. In certain embodiments, the thickness corresponds to a thickness sufficient to cover all sides including lateral sides of the first resist pattern 440 so as to protect the first resist pattern during formation of a second resist pattern 460 described below.

The process 300 proceeds to operation 340 in which a second resist pattern 460 is formed over a portion of the protective layer 450. The operation 340 can use a lithographic technique that is the same as or different from the lithographic technique used to form the first resist pattern 440. In an embodiment in which the protective layer 450 covers only part of the uncovered portion of the field 422 as discussed above, all or part of the second resist pattern 460 may be formed directly on the field 422 without an interposing protective layer.

In an alternative embodiment exemplified by FIG. 6, the process 300, after the formation of the second resist pattern 660 at operation 340, proceeds to operation 350 in which a material to be patterned 670 is deposited. In this alternative embodiment, a layer (e.g., layer 620) over which first and second resist patterns 640, 660 and the protective layer 650 are formed does not include the material to be patterned as in the embodiment exemplified by FIG. 4.

For both embodiments, the process 300 proceeds to operation 360 in which a portion of the material to be patterned (420 or 670) is removed. In the embodiment exemplified by FIG. 4 in which the material to be patterned is deposited below the first and second resist patterns 440, 460 and the protective layer 450, the removal operation 360 comprises removing a first region of the material to be patterned 420 not protected by the first and second resist patterns 440, 460 by an etching operation. The etching operation can comprise RIE.

In the alternative embodiment exemplified by FIG. 6 in which the material to be patterned 670 is deposited over the first and second resist patterns 640, 660 and at least a portion of the protective layer 650, the removal operation 360 comprises removing a first region of the material to be patterned disposed over the first and second resist patterns 640, 660 by a lift-off operation. The lift-off operation can comprise a wet-etching operation to etch the first and second resist patterns 640, 660 by the use of a wet etchant. Alternatively, a dry etching operation based on a plasma etchant may be used instead. The process 300 ends at end state 309.

While some layers or materials (e.g., the material to be patterned 670) were described above as being "disposed or deposited over" previous layers or materials (e.g., the first and second resist patterns 640, 660) for the illustrated embodiments of FIGS. 4 and 6, it shall be appreciated that, in other embodiments, each of the layers or materials may be disposed or deposited below or aside or otherwise adjacent to a side of the previous layer or material depending on the orientation and arrangement of the structure being patterned or the patterning process being employed. Furthermore, as used herein, the phrase "Layer/Material X disposed or deposited over (below, aside, or adjacent to a side of) Layer/Material Y" encompasses those arrangements or embodiments in which there is one or more intermediate layers or materials disposed between the Layer/Material X and the Layer/Material Y.

In the TFH industry, a damascene process may be used to form a perpendicular magnetic recording (PMR) writing head. The damascene process involves forming a groove or a trench in an alumina layer, and then depositing (e.g., electroplating) a pole material (e.g., CoNiFe) into the trench to form a write pole. A patterned hard mask (HM) comprising a metal (e.g., Ru or NiFe) is often employed for patterning the alumina layer.

Figure 5:
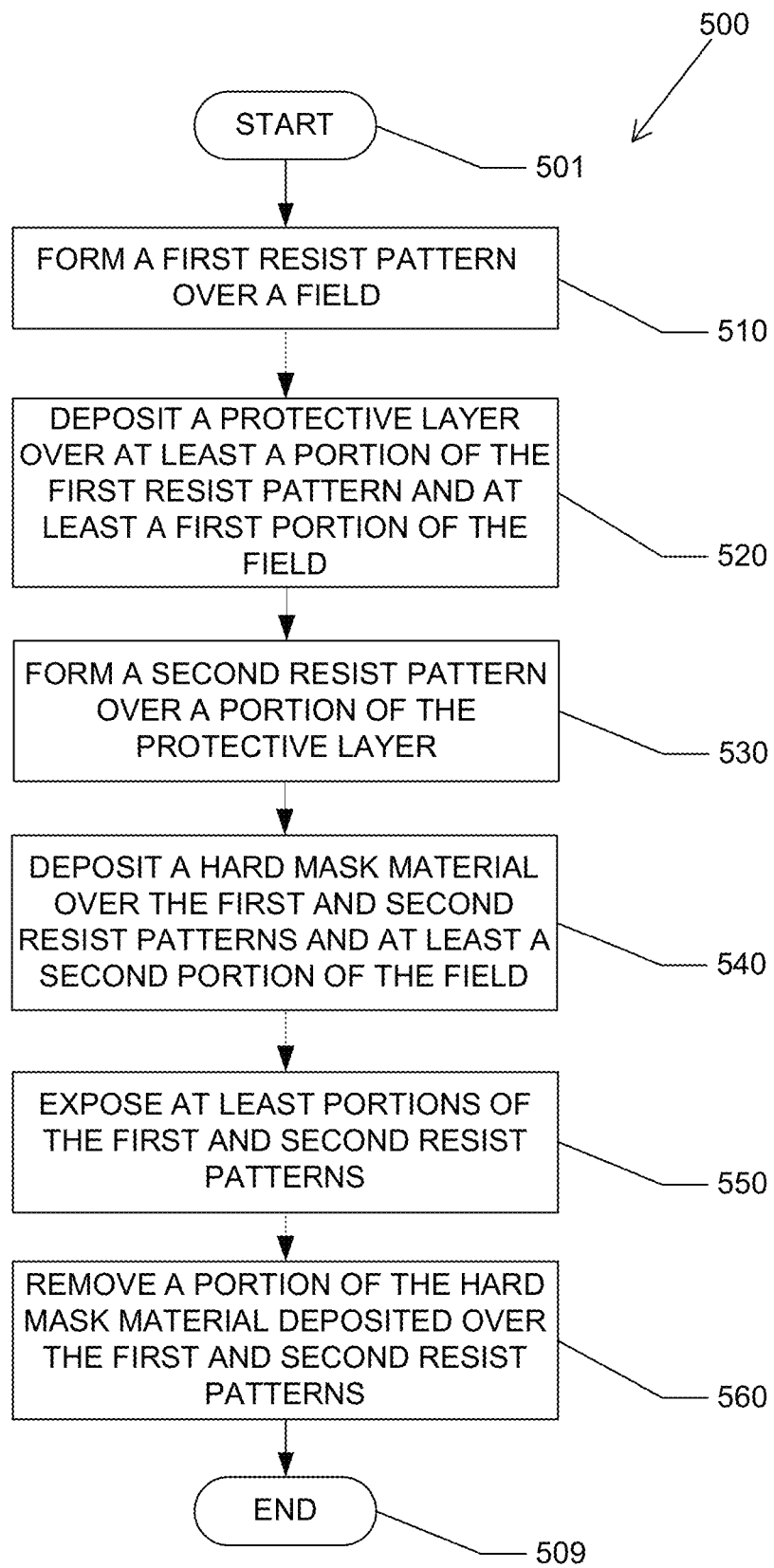
FIG. 5 is a flowchart illustrating an exemplary double patterning process that can be used in the TFH industry to produce a patterned hard mask for damascene PMR fabrication according to one aspect of the subject disclosure.

FIG. 5 is a flowchart illustrating an exemplary double patterning process 500 that can be used to produce a patterned HM for damascene PMR fabrication according to one aspect of the subject disclosure. For the sake of clarity only with no intention of limiting the subject disclosure in any way, the process 500 will be described below with references to various intermediate and final structures shown in FIG. 6. It shall be appreciated by those skilled in the art in view of the present disclosure that the process 500 may be applied to produce thin-film structures in a multitude of applications other than a patterned HM for damascene PMR fabrication.

The process 500 begins at start state 501 and proceeds to operation 510 in which a first lithography is performed to form a first resist pattern 640 over a field 622 (e.g., an upper surface) belonging to a base structure 601. In the illustrated example, the base structure 601 comprises a substrate 610 and an alumina ($Al_2O_3$) layer 620. The first lithography can include any lithographic technique such as photolithography described above with respect to FIG. 3. In the illustrated example of FIG. 6, the first resist pattern 640 comprises an anchoring portion 642 and a nose portion 644. The nose portion has a rectangular shape and extends from the anchoring portion 642.

The process 500 proceeds to operation 520 in which a protective layer 650 is deposited over the first resist pattern 640 and a portion of the field 622 not covered by the first resist pattern 640. While the protective layer 650 is shown to be deposited over all of the first resist pattern 640 and all of the portion of the field 622 not covered by the first resist pattern 640 in the illustrated embodiment of FIG. 6, in an alternative embodiment, only part of the first resist pattern 640 and/or only part of the uncovered portion of the field 622 may be deposited with the protective layer 650. The protective layer 650 can comprise silicon nitride, tantalum, aluminum oxide, or any other material or a combination of materials that can protect the first patterned resist from a process (e.g., photoresist application, exposure, and development) that is used to form a subsequent resist pattern to be described below with respect to operation 530. The protective layer 650 typically has a thickness in a range of between about 10 and 100 angstroms. In certain embodiments, the thickness corresponds to a thickness sufficient to cover all sides including lateral sides of the first resist pattern 640 so as to protect the first resist pattern during formation of a second resist pattern 660 described below.

The process 500 proceeds to operation 530 in which a second resist pattern 660 is formed over a portion of the protective layer 650. The second resist formation operation 530 can use a lithographic technique that is the same as or different from the lithographic technique used to form the first resist pattern 640. In an alternative embodiments in which the protective layer 650 covers only part of the uncovered portion of the field 622, all or part of the second resist pattern 660 may be formed directly on the field 622 without an interposing protective layer. In the illustrated example, the second resist pattern 660 has a substantially triangle shape and covers the anchoring portion 642 of the first resist pattern 640.

The process 500 proceeds to operation 540 in which a hard mask (HM) material 670 is deposited over the first and second resist patterns 640, 660 and a portion of the field 622 that is not covered by the first and second resist patterns 640, 660. In the embodiment illustrated in FIG. 6, all of the portion of the field 622 not covered by the first and second resist patterns 640, 660 is covered by the protective layer 650. However, in alternative embodiments, not all of the portion of the field may be covered by the protective layer 650, and at least some of the hard mask material 670 may be deposited directly on the field 622. The HM material 670 can comprise Ru, Ta, NiFe, or any other material that has a high etching selectivity with respect to a material being patterned via the hard mask.

The process 500 proceeds to operation 550 in which at least portions of the first and second resist patterns 640 and 660 are exposed to prepare for a lift-off operation to be discussed below with respect to operation 560. In the illustrated example, the operation 550 includes side-milling portions of the protective layer 650 and the HM material 670 deposited on lateral sides of the first resist pattern 640 (as indicated by arrows 605) and also side-milling a portion of the HM material 670 deposited on lateral sides of the second resist pattern 660. The operation 550 is designed to expose some portions (e.g., lateral sides) of the first and second resist patterns 640, 660 so that a wet or dry etchant can access the patterns 640, 660 during operation 560 described below.

The process 500 proceeds to operation 560 in which a portion of the hard mask deposited over the first and second resist patterns 640, 660 is removed to form a patterned HM 672. In the illustrated example, the removal is achieved by a lift-off operation in which the first and second resist patterns 640, 660 are removed along with a portion of the HM material 670 deposited thereon by exposing the patterns 640, 660 to a wet or dry etching process. Side and top views of the resulting structure 609 with the patterned HM 672 are shown in sub-FIGS. 5a) and 5b), respectively. In the illustrated example of FIG. 6, the patterned HM 672 comprises an opening having a triangular-shape portion 674 and a rectangular-shaped portion 676 extending from the triangular-shaped portion 674. The process 500 ends at end state 509.

The exemplary double patterning processes set forth above may be applied to many double patterning applications in semiconductor and TFH industries. The exemplary double patterning processes set forth above enjoy various benefits as compared to prior art double patterning processes including: being simpler with only one pattern transfer step for robust and reliable high volume manufacturing. For example, the double patterning processes of the subject disclosure can significantly simplify the manufacturing process as compared to the prior art double patterning processes by consolidating two pattern transfer operations into one transfer operation. The simplification not only reduces manufacturing costs but can also enhance quality and/or reduce defect rate by reducing process variations relating to sizes and relative locations of resulting features, such as the rectangular-shaped portion 676 and the triangular-shaped portion 674 for example.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A method of patterning a hard mask, the method comprising:
   forming a first resist pattern over a field;
   depositing a protective layer over the first resist pattern and at least a first portion of the field;
   forming a second resist pattern over at least a portion of the protective layer, the protective layer protecting the first resist pattern from a patterning process used to form the second resist pattern;
   depositing a hard mask material over the first and second resist patterns and at least a second portion of the field not covered by the first and second resist patterns; and
   forming a patterned hard mask by removing a portion of the hard mask material deposited over the first and second resist patterns,
   wherein the field comprises an aluminum oxide ($Al_2O_3$) layer to be etched via the patterned hard mask, and the $Al_2O_3$ layer is part of a writer structure associated with a perpendicular magnetic recording (PMR) write head.

2. The method of claim 1, wherein the first resist pattern comprises an anchoring portion and a nose portion, the nose portion having a rectangular shape and extending from the anchoring portion.

3. The method of claim 2, wherein the second resist pattern comprises a portion having a substantially triangular shape at least partially covering the anchoring portion of the first resist pattern.

4. The method of claim 3, wherein the patterned hard mask comprises an opening having a triangular-shaped portion and a rectangular-shaped portion extending from the triangular-shaped portion.

5. The method of claim 1, wherein the protective layer comprises a material selected from the group consisting of silicon nitride, tantalum, and aluminum oxide.

6. The method of claim 1, wherein the protective has a thickness in a range of between about 10 and 100 angstroms.

7. The method of claim 1, wherein the protective layer covers a lateral side of the first resist pattern.

8. The method of claim 1, wherein the hard mask material comprises ruthenium.

9. A method of patterning a hard mask, the method comprising:
   forming a first resist pattern over a field;
   depositing a protective layer over the first resist pattern and at least a first portion of the field;
   forming a second resist pattern over at least a portion of the protective layer, the protective layer protecting the first resist pattern from a patterning process used to form the second resist pattern;
   depositing a hard mask material over the first and second resist patterns and at least a second portion of the field not covered by the first and second resist patterns; and
   forming a patterned hard mask by removing a portion of the hard mask material deposited over the first and second resist patterns,
   wherein the removing comprises performing a lift off operation, the lift-off operation comprises subjecting the first and second resist patterns to a wet etching operation, and the removing further comprises performing an ion milling operation to expose sides of the first and second resist patterns prior to subjecting the first and second resist patterns to the wet etching operation.

* * * * *